United States Patent [19]
Cathey

[11] Patent Number: 5,358,601
[45] Date of Patent: Oct. 25, 1994

[54] PROCESS FOR ISOTROPICALLY ETCHING SEMICONDUCTOR DEVICES

[75] Inventor: David A. Cathey, Boise, Id.

[73] Assignee: Micron Technology, Inc., Boise, Id.

[21] Appl. No.: 121,089

[22] Filed: Sep. 14, 1993

Related U.S. Application Data

[63] Continuation of Ser. No. 765,152, Sep. 24, 1991, abandoned.

[51] Int. Cl.$^5$ .............................. H01L 21/00
[52] U.S. Cl. .................. 156/656; 156/657; 156/662; 156/643; 156/646
[58] Field of Search ........... 156/646, 643, 662, 659.1, 156/656, 657, 664

[56] References Cited

U.S. PATENT DOCUMENTS

| | | | |
|---|---|---|---|
| 4,255,230 | 3/1981 | Zajac | 156/643 |
| 4,468,285 | 8/1984 | Bayman et al. | 156/643 |
| 4,659,426 | 4/1987 | Fuller et al. | 156/643 |
| 4,726,879 | 2/1988 | Bondur et al. | 156/656 |
| 4,734,157 | 3/1988 | Carbaugh et al. | 156/643 |
| 4,778,563 | 10/1988 | Stone | 156/643 |
| 4,836,886 | 6/1989 | Daubenspeck | 156/656 |
| 4,836,887 | 6/1989 | Daubenspeck et al. | 156/656 |
| 4,855,017 | 8/1989 | Douglas | 156/643 |
| 4,863,549 | 9/1989 | Grünwald | 156/643 |
| 5,110,411 | 5/1992 | Long | 156/656 |

FOREIGN PATENT DOCUMENTS 2150026  6/1990  Japan .

Primary Examiner—R. Bruce Breneman
Assistant Examiner—George Goudreau

[57] ABSTRACT

The etchant material of this invention comprises a chemical etchant composition including a halogen-containing feed gas and gaseous carbon dioxide. Typically, the halogen-containing feed gas is a fluorine-containing or a chlorine-containing feed gas, or both a fluorine-containing and a chlorine-containing feed gas. Preferably, the chlorine-containing feed gas comprises chlorine gas or HCl, and the fluorine-containing feed gas comprises $SF_6$ or $NF_3$. The fluorine-containing feed gas can also comprise $CF_4$, or $C2F_6$.

4 Claims, 1 Drawing Sheet

PROCESS FOR ISOTROPICALLY ETCHING SEMICONDUCTOR DEVICES

This application is a continuation of application Ser. No. 07/765,152 filed Sep. 24, 1991, now abandoned.

BACKGROUND OF THE INVENTION

This invention relates to a process for etching semiconductor devices, and more particularly to a process for effectively and efficiently isotropically etching multi-layer semiconductor devices having adjacent tungsten silicide-polysilicon layers.

It is known in the prior art that the manufacture of multi-layer semiconductor devices typically involves patterned etching of areas of the semiconductor surface which is not covered by a pattern of photoresist protective material. These etching techniques use liquid or wet etching materials, or dry etching with halogens or halogen-containing compounds, of certain layers of these devices. For example, one well known etching material is a chlorine-containing plasma where chlorine gas, hydrogen chloride or other feed gas may be the source of the chlorine. Chlorine etches the semiconductor isotropically, i.e., in both a lateral and vertical direction. This results in an etched feature which has a line width which is smaller than the exposed resist image.

Etching of the semiconductor devices can be conducted in a gas phase using known techniques such as plasma etching, ion beam etching, and reactive ion etching. In isotropic plasma etching the requisite portion of the surface to be etched is removed by a chemical reaction between gaseous ions, radicals, or reactive chemicals from the ionized feed and the subject surface. In the anisotropic process, etching takes place only or primarily in the vertical direction so that feature widths substantially match the photoresist pattern widths. For example, in U.S. Pat. No. 4,734,157 an elemental silicon-containing layer, such as a layer of polysilicon or silicide, is etched anisotropically employing a gas plasma comprising a gaseous chlorofluorocarbon, capable of supplying $CF_x$ and chlorine ions, and ammonia. Profile control of a silicon layer is controlled by the use of this etching mode.

A problem which occurs during the isotropic plasma etching of multilayer semiconductor materials is matching the horizontal etch rates of the dissimilar materials which make up the semiconductor structure. For example, as shown in FIG. 1, the metal layers of semiconductor device 10A are adjacent tungsten silicide 12-polysilicon 14 layers on a layer of silicon dioxide 18 which is under a photoresist layer 16. This structure is used in the formation of, for example, an L.D.D. MOS transistor. When a chlorine plasma or SF6 plasma etchant is employed, an over etch situation can occur in which the polysilicon layer 14 is undercut much faster than the tungsten silicide layer 12 leaving a blocking ledge. This ledge will subsequently block the lightly doped drain implant process and prevent formation of source and drain regions of the transistor or the underlapping edge of the gate region. It can also serve as a topology and void problem at later fabrication stages.

In another etching sequence involving SF6/O2, the tungsten silicide layer 12 will undercut too fast under photoresist layer 16 resulting in an undesirable over etch of the silicide layer 14 so that semiconductor device 10B has a configuration similar to that shown in FIG. 2. In this case, an asymmetrical profile having high resistance runners are formed in which the tungsten silicide layer 12 is significantly narrower than the polysilicon layer 14. This produces a high resistant electrical connector which is an undesirable property in commercial use.

When SF6/O2/Cl2 plasma is used to solve the uneven undercutting problem by matching the profiles of the respective tungsten silicide and polysilicon layers, the resist sidewalls are chemically attacked by oxygen gas causing the fabricator to use much larger sized resist starting geometries in order to compensate for the above erosion conditions. The use of such larger resist layers adversely effects the spacing density of the etched devices along the silicon support and substantially adds to the cost of manufacture of the semiconductor device.

Therefore, a need exists for an isotropic semiconductor etching process which forms the requisite resist-tungsten silicide-polysilicon configuration required for effective formation of L.D.D. MOS transistors during the source drain ion implantation process with minimum resist loss and with correspondingly reduced usage of resist material.

SUMMARY OF THE INVENTION

The process of the present invention meets the above-described existing needs in semiconductors by forming tungsten silicide-polysilicon sidewalls 12 and 14 under a photoresist layer 16 on a layer of silicon dioxide have profiles which are substantially similar in magnitude (see FIG. 3). This is accomplished employing a process for isotropically etching a semiconductor device to form a predetermined etched pattern therein. The process comprises providing a semiconductor device having a plurality of structural layers. One of the outer structural layers of the semiconductor device comprises a tungsten polysilicide layer on a polysilicon layer. In the etching process, a protective etch mask defining a plurality of openings in a predetermined pattern is first formed a major surface of the semiconductor device, typically on the outer surface of the tungsten polysilicide layer. This exposes a plurality of areas of the major surface of the semiconductor device corresponding to a predetermined pattern of openings. The etching operation can then commence. The plurality of exposed areas of the major surface of the semiconductor device are etched with an etchant material to form an etched profile in which the tungsten silicide layer and in the polysilicon layer have a substantially similar etch profile while maintaining a minimum amount of loss of the protective etch mask. At the same time, the process of the present invention avoids (a) the polysilicon layer being over etched with respect to the tungsten silicide layer forming a ledged-shaped profile which causes a drain implant problem, and (b) the tungsten polysilicide layer being over etched with respect to the polysilicon layer to form an asymmetrical profile which causes high electrical resistance runners. Therefore, doping material can be effectively and uniformly implanted away from the edge of the etched profile during the high dose implant portion of the formation of the MOS L.D.D. transistors within the semiconductor device. Moreover, because the respective tungsten silicide and polysilicon layers are substantially matched, having a similar etch profile, the desired low resistance of the semiconductor device is maintained intact. Finally, the etching of the tungsten silicide layer and the polysilicon layer can be effected with minimum degradation of the chemical etchant protective patterned layer and without requiring the formation of an oversized and more costly chemical etchant protective patterned layer. This results in significant cost savings due to reduced die sizes.

Specifically, the etchant material of this invention comprises a chemical etchant composition including a halogen-containing feed gas and gaseous carbon dioxide. Typically, the halogen-containing feed gas is a fluorine-containing or a chlorine-containing feed gas, or both a fluorine-containing and a chlorine-containing feed gas. Preferably, the chlorine-containing feed gas comprises chlorine gas or HCl, and the fluorine-containing feed gas comprises $SF_6$ or $NF_3$. The fluorine-containing feed gas can also comprise $CF_4$ or $C_2F_6$.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
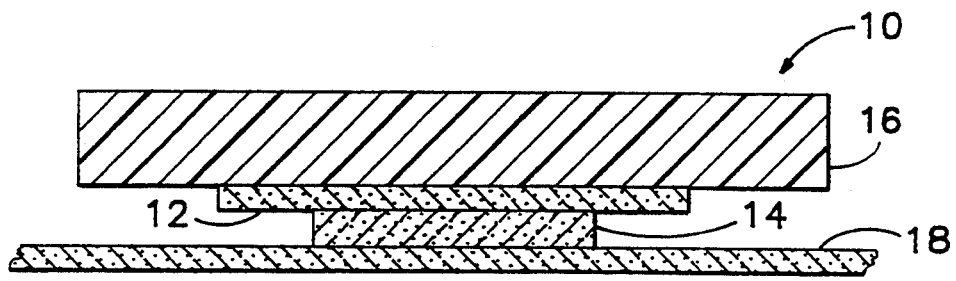
FIG. 1 is a pictorial representation of one form of a prior art semiconductor sidewall profile in which the tungsten silicide layer is over etched with respect to the polysilicon layer.
Figure 2:
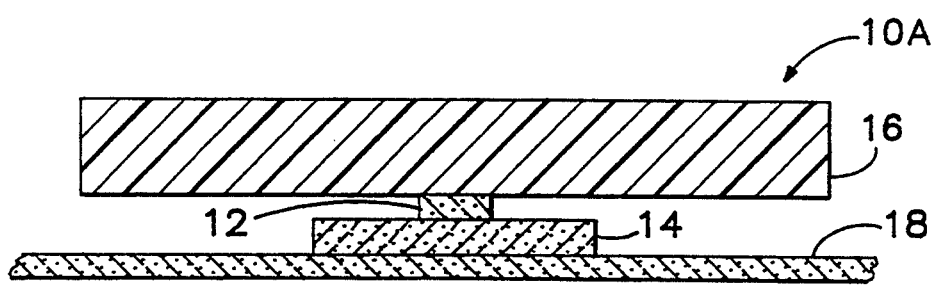
FIG. 2 is a pictorial representation of another form of a prior art semiconductor sidewall profile in which the polysilicon layer is over etched with respect to the tungsten silicide layer.
Figure 3:
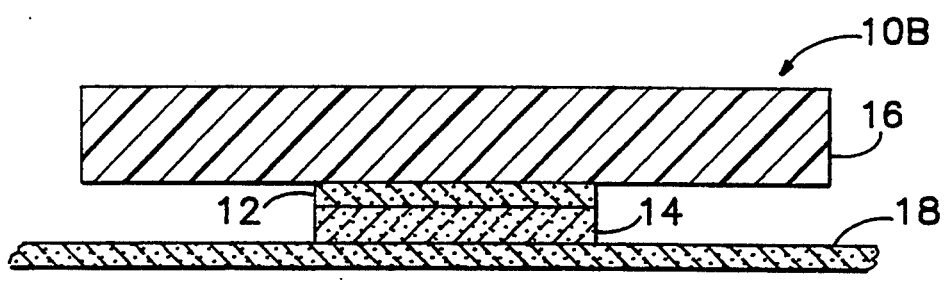
FIG. 3 is a pictorial representation of a semiconductor sidewall profile of the present invention wherein the tungsten silicide layer and the polysilicon have substantially similar etch profiles.

The inventive process herein is directed to isotropically etching a semiconductor device. Referring now to FIG. 3, a schematic representation of a semiconductor device, generally designated as "10", is depicted. The subject semiconductor device comprises a plurality of structural layers which are sequentially deposited onto an underlying silicon structure 18. As shown in FIG. 3, semiconductor device 10 comprises a plurality of structural layers including an outer layer 14, having sidewalls 14a and a major outer surface 14b, and is fabricated of tungsten silicide. The outer layer 14 is deposited onto an adjacent intermediate structural layer 16, having sidewalls 16a, and is fabricated of polysilicon. Also shown in FIG. 3 is a chemical etchant protective patterned layer, which comprises a photoresist layer having a predetermined arrangement of openings for forming a predetermined pattern in semiconductor device 10. Typically, this is accomplished using a photomask and known conventional patterning techniques.

A preferred manner of etching of the respective structural layers 14 and 16 is by plasma etching. The plasma etch technique employed herein typically has an etching area in a plasma which is generated under vacuum within the confines of an RF discharge unit. The preferred plasma etch technique employed herein may include the use of ECR, electro cyclotron resonance, RIE, MIE, PE reactive ion, point plasma etching, magnetically confined PE, or magnetron PE.

The semiconductor device is then located within an etching area and is etched with an etchant material to form a predetermined pattern therein. The etchant material comprises a chemical etchant composition including a halogen-containing material and gaseous carbon dioxide. The chemical etchant composition and the coating composition are in a substantially gas phase during the etching of the semiconductor device. The preferred halogen-containing materials comprise a fluorine-containing material and/or a chlorine-containing material. The chlorine-containing material can comprise HCl or chlorine gas. The fluorine-containing material can be selected from the group consisting of HF, fluorine gas, $SF_6$, and $NF_3$. It can also be a fluorinated hydrocarbon such as $CF_4$ and $C_2F_6$.

By employing the etchant material of the present invention, the sidewalls 14a and 16a of the tungsten silicide and polysilicon layers, respectively, are of substantially coincide with the sidewalls 12a of the resist layer (see FIG. 3). This allows the requisite implant configuration to be formed while simultaneously maintaining low resistances of the final etched pattern, and a minimum sized initial mask feature.

The tungsten silicide and polysilicon layer are patterned by reaction with ionized feed gas forming volatile by-products. In this way, the etching process can provide for the formation of the upright sidewalls in etched layers comprising the silicon or metal material which have a profile that is controllably recessed under the original etch mask.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A process for controllably, isotropically etching a semiconductor device to form an etched pattern therein, comprising:
   a) providing a semiconductor device having a plurality of structural layers, one of the outer structural layers of the semiconductor device comprising a tungsten polysilicide layer on a polysilicon layer;
   b) forming on a top surface of the semiconductor device a protective etch mask defining a plurality of openings, said plurality of openings exposing a plurality of areas of the top surface of the semiconductor device;
   c) controllably isotropically etching the plurality of exposed areas of the top surface of the semiconductor device with an etchant material to form an etched profile in which the tungsten polysilicide layer and the polysilicon layer are etched at similar etch rates to form a similar etch profile, and producing a tungsten polysilicide/polysilicon profile having vertical sides and having resist overhang projecting laterally from the vertical sides of the tungsten polysilicide/polysilicon profile;
   d) the etchant material comprising a chemical etchant composition including $NF_3$, a gaseous carbon dioxide; and at least one of chlorine gas and HCL.

2. A process for controllably, isotropically plasma etching a semiconductor device to form an etched pattern therein, comprising:
   a) providing a semiconductor device having a plurality of structural layers, one of the outer structural layers of the semiconductor device comprising a tungsten polysilicide layer on a polysilicon layer;
   b) forming on a top surface of the semiconductor device a protective etch mask defining a plurality of openings, said plurality of openings exposing a plurality of areas of the top surface of the semiconductor device;

c) controllably isotropically etching the plurality of exposed areas of the top surface of the semiconductor device with an etchant material to form an etched profile in which the tungsten polysilicide layer and the polysilicon layer are etched at similar etch rates to form a similar etch profile, and producing a tungsten polysilicide/polysilicon profile having vertical sides and having resist overhang projecting laterally from the vertical sides of the tungsten polysilicide/polysilicon profile;

d) the etchant material comprising a chemical etchant composition including a chlorine-containing material, a gaseous carbon dioxide, and a fluorine-containing material;

e) the fluorine-containing material being $CF_4$; and f) the chlorine-containing material is selected from the group consisting of chlorine gas or HCL.

3. A process for controllably, isotropically plasma etching a semiconductor device to form an etched pattern therein, comprising:

a) providing a semiconductor device having a plurality of structural layers, one of the outer structural layers of the semiconductor device comprising a tungsten polysilicide layer on a polysilicon layer;

b) forming on a top surface of the semiconductor device a protective etch mask defining a plurality of openings, said plurality of openings exposing a plurality of areas of the top surface of the semiconductor device;

c) controllably isotropically etching the plurality of exposed areas of the top surface of the semiconductor device with an etchant material to form an etched profile in which the tungsten polysilicide layer and the polysilicon layer are etched at similar etch rates to form a similar etch profile, and producing a tungsten polysilicide/polysilicon profile having vertical sides and having resist overhang projecting laterally from the vertical sides of the tungsten polysilicide/polysilicon profile;

d) the etchant material comprising a chemical etchant composition including, a chlorine-containing material, a gaseous carbon dioxide, and a fluorine-containing material;

e) the fluorine-containing material comprising $C_2F_6$; and f) the chlorine-containing material is selected from the group consisting of chlorine gas or HCL.

4. A process for using a plasma etchant material for isotropically plasma etching a semiconductor device to form an etched pattern therein, comprising:

a) providing an etchant material comprising a chemical etchant composition including a fluorine-containing material, a chlorine-containing material and gaseous carbon dioxide;

b) providing a semiconductor device having a plurality of structural layers, one of the outer structural layers of the semiconductor device comprising a tungsten polysilicide layer on a polysilicon layer;

c) forming on a top surface of the semiconductor device a protective etch mask defining a plurality of openings in a pattern, said plurality of openings exposing a plurality of areas of the top surface of the semiconductor device;

d) controllably isotropically plasma etching the plurality of exposed areas of the top surface of the semiconductor device with an etchant material to form an etched profile in which the tungsten polysilicide layer and the polysilicon layer are etched at a similar etch rate to form a similar etch profile, and producing a tungsten polysilicide/polysilicon profile having vertical sides and having resist overhang projecting laterally from the vertical sides of the tungsten polysilicide/polysilicon profile; and e) the fluorine-containing material is selected from the group consisting of $C_2F_6$.

* * * * *